(12) United States Patent
Liu et al.

(10) Patent No.: US 9,679,979 B2
(45) Date of Patent: Jun. 13, 2017

(54) SEMICONDUCTOR STRUCTURE FOR FLASH MEMORY CELLS AND METHOD OF MAKING SAME

(71) Applicant: Taiwan Semiconductor Manufacturing Company, Ltd., Hsin-Chu (TW)

(72) Inventors: Ming Chyi Liu, Hsinchu (TW); Chang-Ming Wu, New Taipei (TW); Shih-Chang Liu, Kaohsiung County (TW); Wei Cheng Wu, Hsinchu County (TW); Harry-Hak-Lay Chuang, Singapore (SG); Chia-Shiung Tsai, Hsin-Chu (TW); Ru-Liang Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 137 days.

(21) Appl. No.: 14/179,687

(22) Filed: Feb. 13, 2014

(65) Prior Publication Data

US 2015/0228740 A1   Aug. 13, 2015

(51) Int. Cl.
| | | |
|---|---|---|
| *H01L 21/28* | (2006.01) | |
| *H01L 29/423* | (2006.01) | |
| *H01L 27/115* | (2006.01) | |
| *H01L 27/11521* | (2017.01) | |
| *H01L 29/66* | (2006.01) | |

(52) U.S. Cl.
CPC .. *H01L 29/42328* (2013.01); *H01L 21/28273* (2013.01); *H01L 27/11521* (2013.01); *H01L 29/66825* (2013.01)

(58) Field of Classification Search
CPC . H01L 29/66; H01L 29/66825; H01L 29/788; H01L 21/28; H01L 21/28273; H01L 27/115; H01L 27/11521; H01L 29/423; H01L 29/42328
See application file for complete search history.

(56) References Cited

U.S. PATENT DOCUMENTS

| | | | | |
|---|---|---|---|---|
| 6,207,504 B1 * | 3/2001 | Hsieh | ............... | H01L 27/115 257/E21.682 |
| 2006/0286746 A1 * | 12/2006 | Wu | ............... | H01L 27/115 438/257 |
| 2008/0054333 A1 * | 3/2008 | Kim | ............... | H01L 21/26513 257/315 |
| 2009/0207662 A1 * | 8/2009 | Wang | ............... | H01L 27/11521 365/185.18 |

(Continued)

*Primary Examiner* — Fazli Erdem
(74) *Attorney, Agent, or Firm* — Haynes and Boone, LLP

(57) ABSTRACT

Semiconductor structures are presented. An exemplary semiconductor structure comprises a common source region having a sawtooth profile, and a flat erase gate disposed above the common source region. Methods of making semiconductor structures are also presented. An exemplary method comprises forming a plurality of trenches in a substrate thereby forming a plurality of active regions; forming a common source region in the substrate in a direction perpendicular to the active regions. The exemplary method further comprises, after forming the common source region, forming a dielectric feature on the substrate thereby filling the trenches and forming a plurality of shallow trench isolation features, and forming an erase gate on the dielectric feature.

19 Claims, 20 Drawing Sheets

(56) References Cited

U.S. PATENT DOCUMENTS

| | | | |
|---|---|---|---|
| 2013/0207174 A1* | 8/2013 | Wang | H01L 21/28273 257/316 |
| 2015/0021679 A1* | 1/2015 | Tsair | H01L 29/788 257/320 |
| 2015/0179749 A1* | 6/2015 | Chen | G11C 16/10 365/185.18 |

* cited by examiner

SEMICONDUCTOR STRUCTURE FOR FLASH MEMORY CELLS AND METHOD OF MAKING SAME

BACKGROUND

Flash memory is an increasingly popular type of non-volatile memory (NVM). NVM is a type of memory storage that can retain data even while it is not powered on.

A typical flash memory includes a memory array having a large number of memory cells arranged in blocks. Each of the memory cells includes a field effect transistor having a control gate and a floating gate. Pairs of field effect transistors share a common source region. Conventional techniques for forming a common source region involve formation of floating gate and control gate structures prior to etching to form a common source region between the structures. As device sizes decrease a width between field effect transistors and an aspect ratio relating a depth to the common source region to a width between field effect transistors makes it difficult to etch a region for the common source without damaging gate structures of the transistors.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
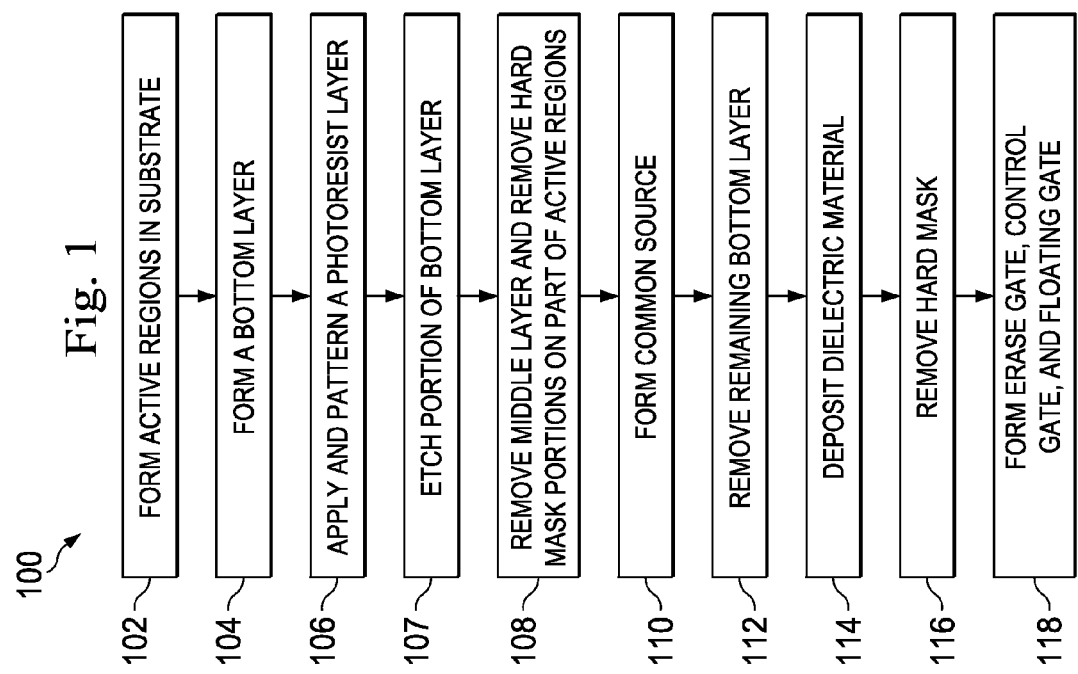
FIG. 1 is a flowchart illustrating a method of making a semiconductor structure according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

FIG. 1 is a flowchart of one embodiment of a method 100 of making a semiconductor device or structure. FIGS. 2A through 2I are perspective views of a semiconductor device or structure 200 at various fabrication stages constructed according to aspects of the present disclosure in one or more embodiments. The semiconductor structure 200 and the method 100 of making the semiconductor structure are collectively described with reference to FIG. 1 and FIGS. 2A through 2I.

Figure 2A:
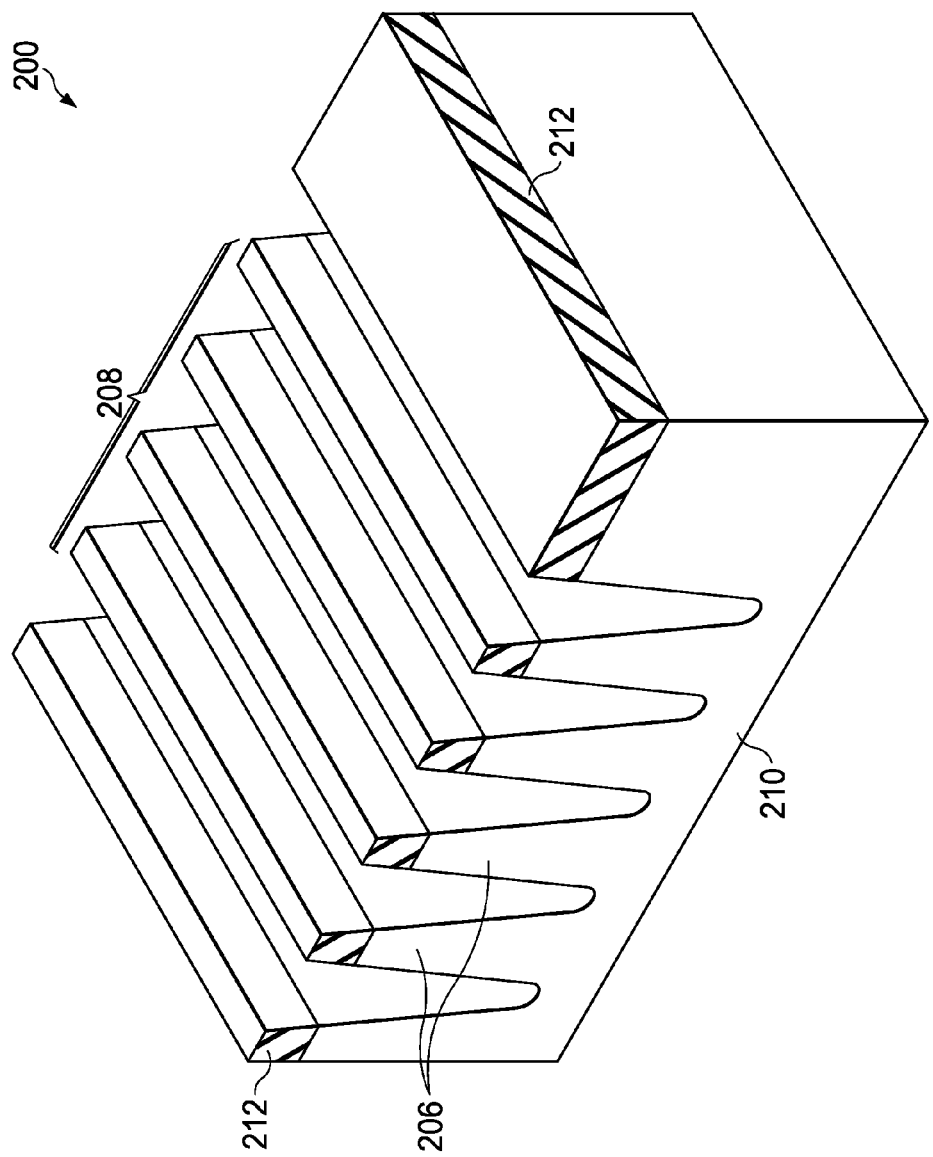
FIGS. 2A-2I illustrate perspective views of one embodiment of a semiconductor structure at various stages of fabrication according to the method of FIG. 1.

Referring to FIGS. 1 and 2A, the method begins at operation 102 by forming active regions 206 in a substrate 210. In some embodiments, the substrate 210 includes silicon (Si), germanium (Ge), silicon germanium, or other proper semiconductor materials that may be single layer or multi-layers of those combinations. Although four active regions 206 are indicated, there can be any number of active regions 206, depending, for example, on the memory array size. The active regions 206 are formed using conventional techniques, such as by applying a hard mask 212 to the substrate 210 and then applying a photolithography process in which a photoresist layer is applied and selectively exposed. Example hard mask material layers include silicon oxide or silicon nitride. The exposed portions of the photoresist layer are removed, and an etching process is performed to remove portions of the hard mask 212 left exposed by removed portions of the photoresist layer. The etching process also etches trenches in the substrate 210 as shown, resulting in a comb-shaped or sawtooth-shaped trench structure 208 in the substrate 210. The trenches and active regions 206 are formed in an alternating pattern as shown. In the trench etching, the hard mask 206 and the semiconductor substrate 210 may be etched by various methods, including a dry etch, a wet etch, or a combination of dry etch and wet etch. The dry etching process may implement fluorine-containing gas (e.g., $CF_4$, $SF_6$, $CH_2F_2$, $CHF_3$, and/or $C_2F_6$), chlorine-containing gas (e.g., $Cl_2$, $CHCl_3$, $CCl_4$, and/or $BCl_3$), bromine-containing gas (e.g., HBr and/or $CHBR_3$), oxygy-containing gas, iodine-containing gas, other suitable gases and/or plasmas, or combinations thereof. The etching process may include a multiple-step etching to gain etch selectivity, flexibility and desired etch profile.

Figure 2B:
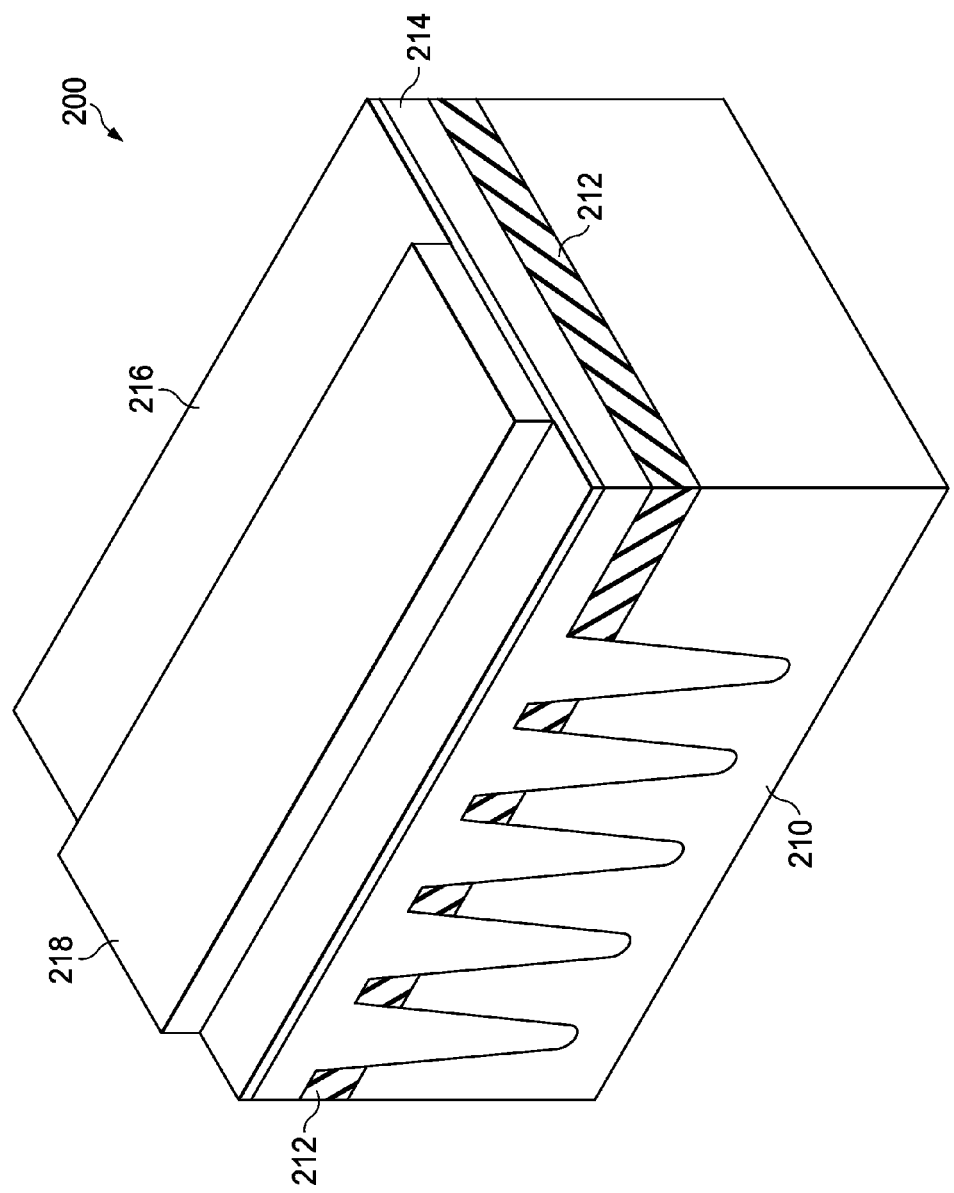

Referring to FIGS. 1 and 2B, the method continues in operation 104 by applying a bottom layer 214 to fill in the trenches in the trench structure 208. The bottom layer 214 comprises organic material, e.g., carbon-containing polymer. The molecular weight of the bottom layer 214 can be between 500 and 500000. In some embodiments, the bottom layer 214 is formed by applying a material and using spin coating to fill in the trenches and to cover the active regions 206. A middle layer 216 is optionally applied to help form a flat surface on the bottom layer 214 on which to place a photoresist layer 218. The method continues in operation 106 by applying and patterning a photoresist layer 218. The photoresist layer 218 is patterned using conventional photolithography techniques. In some embodiments, the shape of the patterned photoresist layer 218 is as shown in FIG. 2B.

Figure 2C:
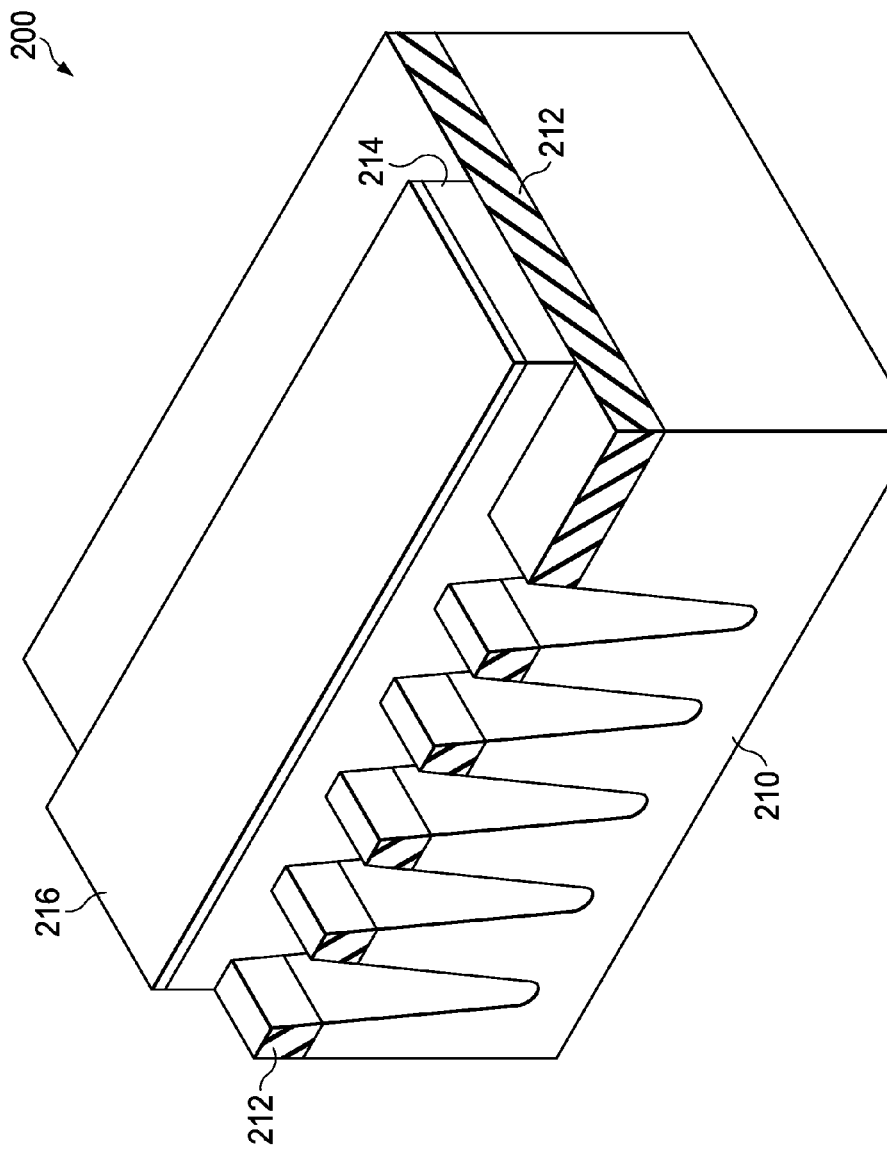

Referring to FIGS. 1 and 2C, the method continues in operation 107 by etching the indicated portion of the bottom layer 214 shown in FIG. 2C. An etching process is applied to remove the portions of the bottom layer 214 and the middle layer 216 that are not covered by the photoresist layer 218. The etching may be any appropriate process for removing the indicated portion of the bottom layer 214. For example, in some embodiments, the etching process is a dry etching process that utilizes $Cl_2$, $BCl_3$, argon, and/or Fluorine.

Figure 2D:
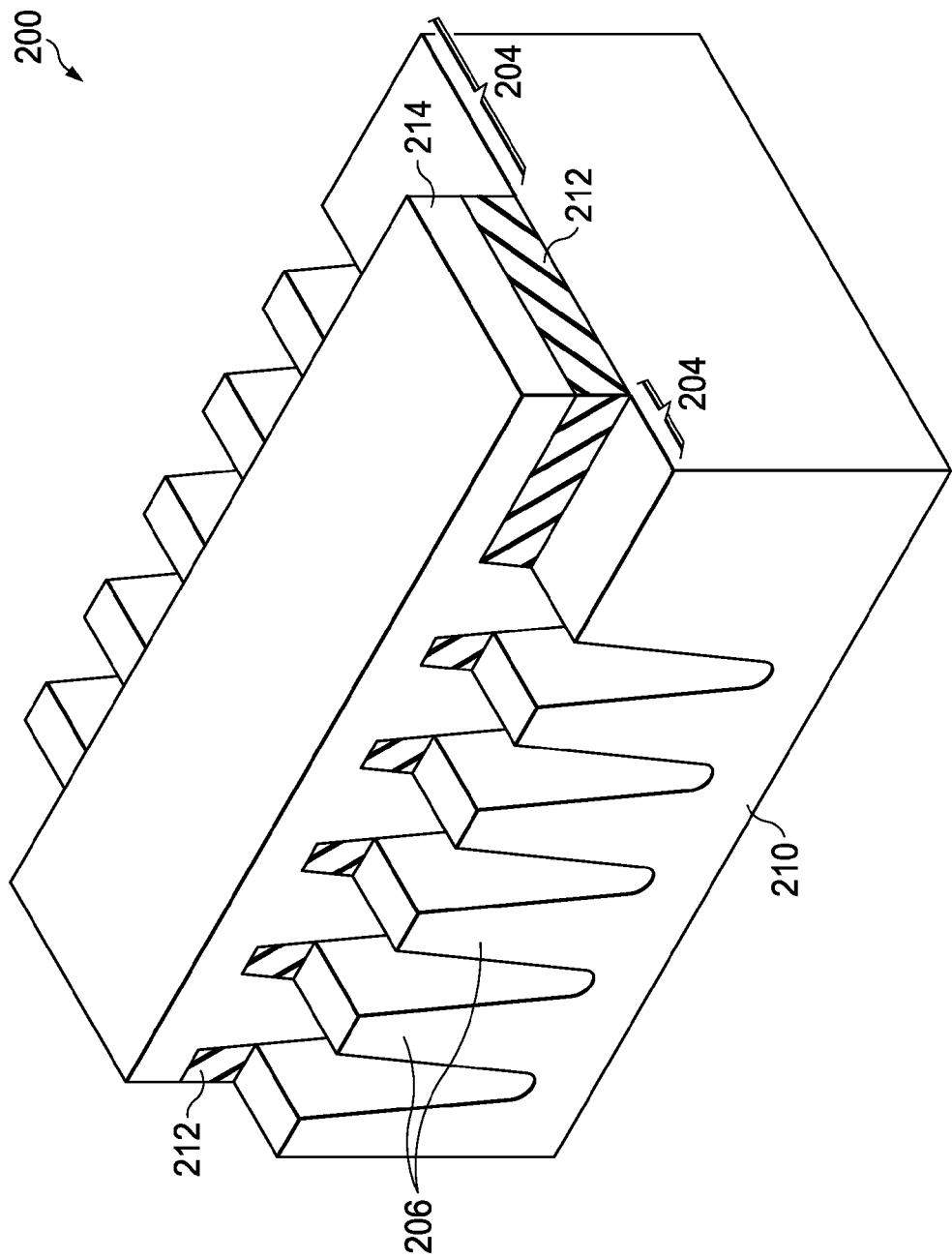

Referring to FIGS. 1 and 2D, the method continues in operation 108 by removing the indicated portion of the middle layer 216 and the hard mask 212. The operation 108 yields exposed portions of the active regions 206. The operation 108 also yields recess regions 204 wherein there is no hard mask 212 or bottom layer 214 in contact with the substrate 210. For the purpose of illustration, there are two recess regions 204 in FIG. 2D, but the method applies to the creation of any number of recess regions.

Figure 2E:
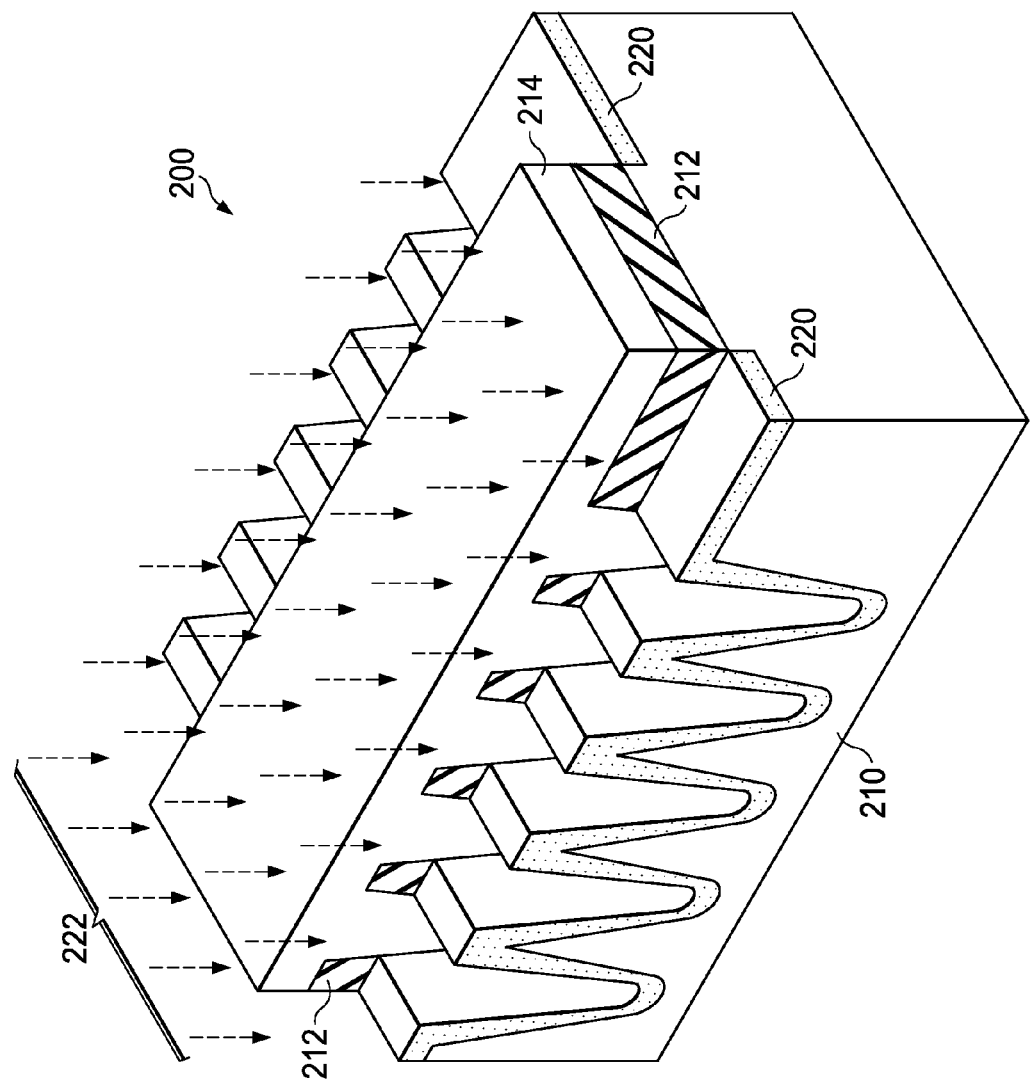

Referring to FIGS. 1 and 2E, the method continues in operation 110 by forming common source region 220 in the recessed regions 204. The common source regions 220 may be formed by various known ion implantation processes 222. In some embodiments, dopants such as phosphorus (P) or arsenic (As) are used for implantation. Note that unlike conventional processes, a common source region 220 is formed before any corresponding floating gate or control gate. The common source region 220 has the comb-shaped or sawtooth-shaped profile shown in FIG. 2H.

Figure 2F:
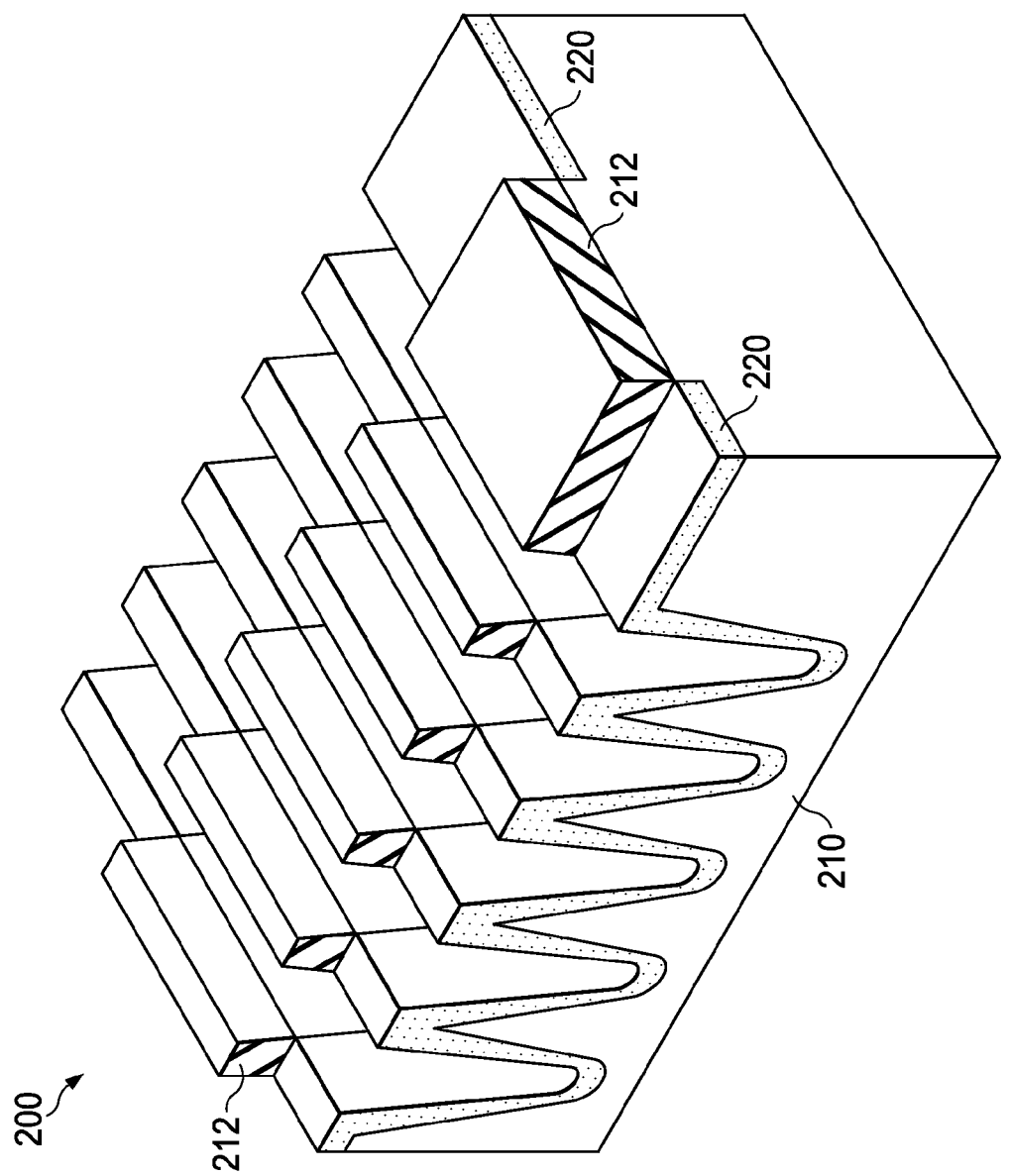

Referring to FIGS. 1 and 2F, the method continues in operation 112 by removing the remaining bottom layer 214 resulting in the semiconductor structure 200 in FIG. 2F. The removal of the bottom layer 214 can be performed using conventional etching techniques such as using oxygen-containing plasma.

Figure 2G:
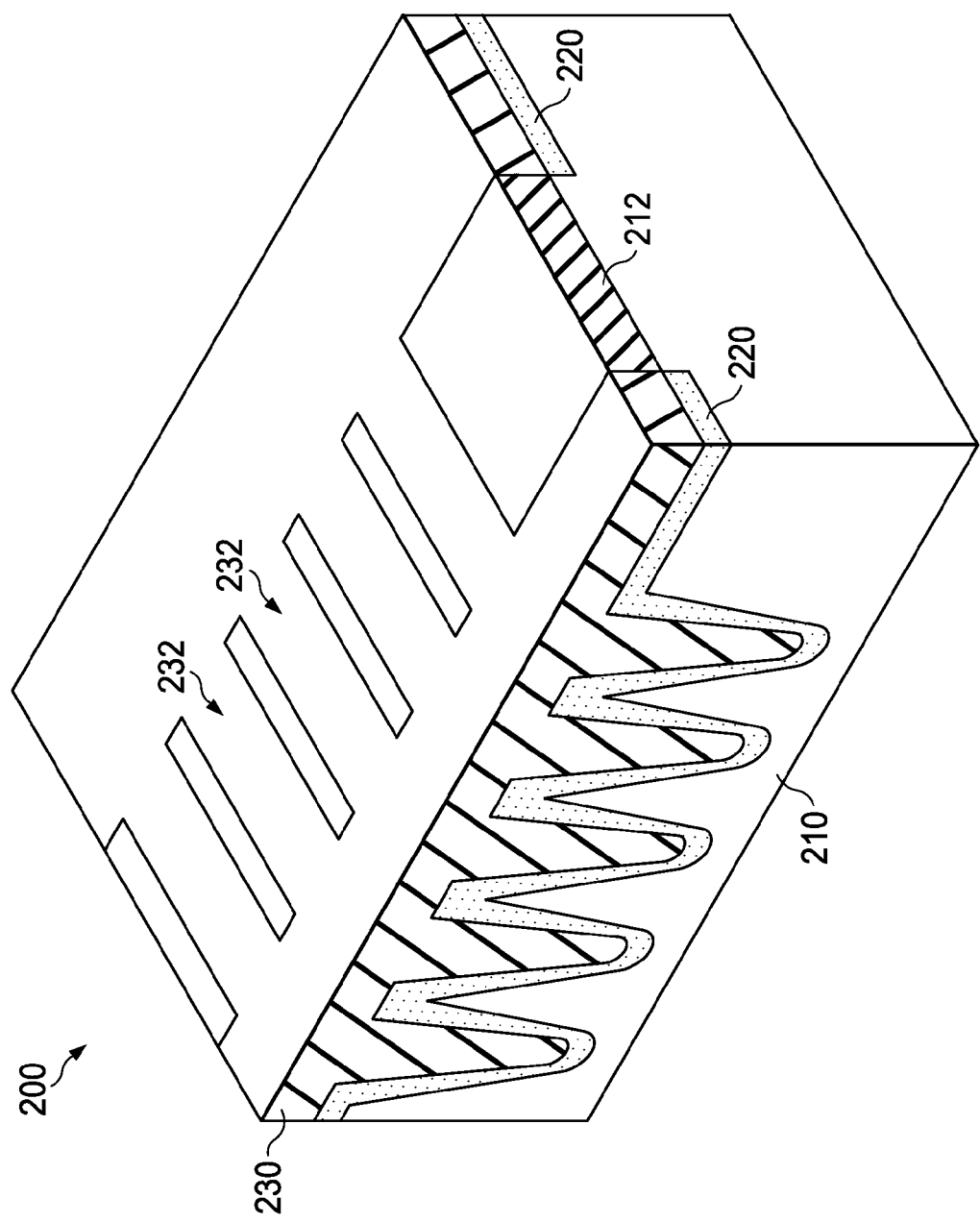

Referring to FIGS. 1 and 2G, the method continues in operation 114 by depositing a dielectric material to form a dielectric material layer 230. The dielectric material layer 230 may comprise a dielectric material suitable for shallow trench isolation. In some embodiments, the dielectric material layer 230 comprises silicon oxide, silicon nitride, silicon oxynitride, other suitable materials, or combinations thereof. The dielectric material layer 230 is formed by any suitable process. In some other embodiments, the dielectric material layer 230 comprises more than dielectric material layer. As one example, the dielectric material layer 230 is formed by filling the trenches between active regions with one or more dielectric materials by using a suitable technique, such chemical vapor deposition (CVD). In some examples, the filled trench may have a multi-layer structure such as a thermal oxide liner layer filled with silicon nitride or silicon oxide. An annealing process may be performed after the formation of the dielectric material layer 230. The dielectric material layer 230 defines and electrically isolates various active regions. In some embodiments, operation 114 further includes chemical mechanical polishing (CMP). For example, CMP can be applied to planarize or flatten a surface of the dielectric material layer 230. The dielectric material layer 230 comprises a plurality of shallow trench isolation features 232 between the active regions.

Figure 2H:
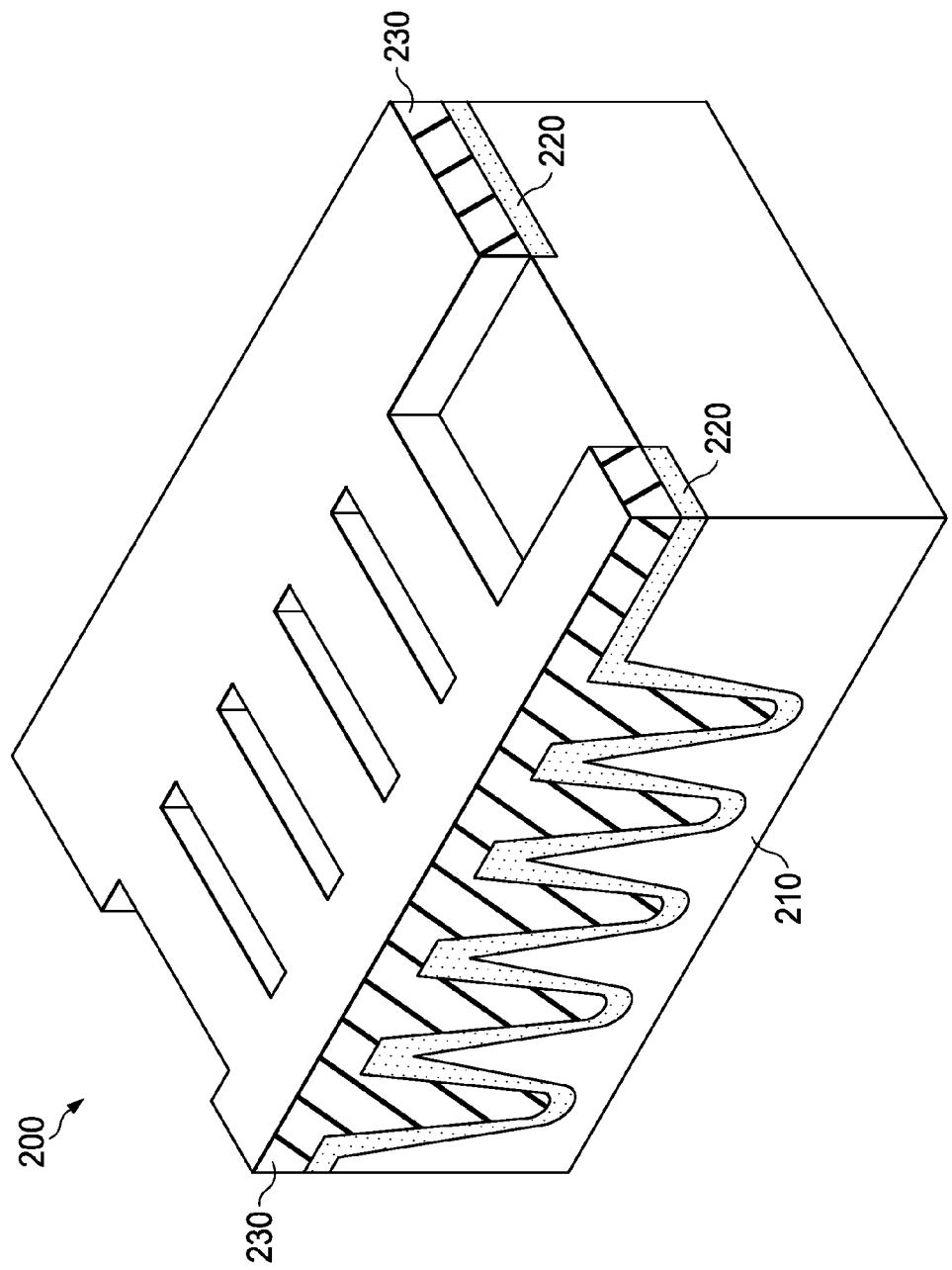

Referring to FIGS. 1 and 2H, the method continues in operation 116 by removing the remaining hard mask layer 212, resulting in the semiconductor structure 200 illustrated in FIG. 2H.

Figure 2I:
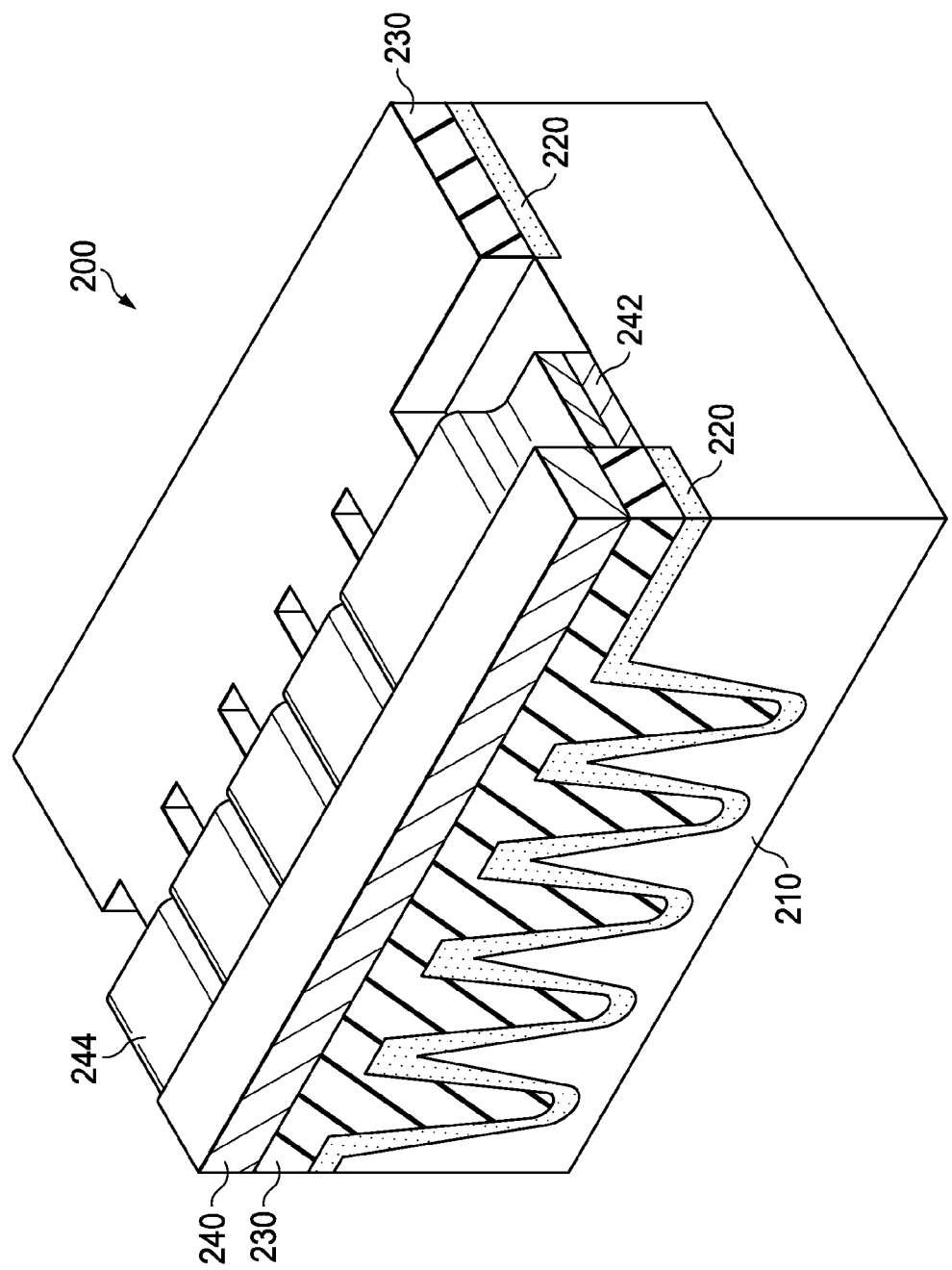

Referring to FIGS. 1 and 2I, the method continues in operation 118 by forming an erase gate 240, a floating gate 242 and a control gate 244. The erase gate 240 may be formed using conventional techniques. For example, in some embodiments the erase gate 240 includes an erase gate dielectric and an erase gate electrode on the erase gate dielectric. In some embodiments, the erase gate dielectric includes a silicon dioxide layer disposed on the field oxide. Alternatively, the erase gate dielectric may include silicon oxide, high dielectric-constant (high k) materials, silicon oxynitride, other suitable materials, or combinations thereof. The high k material may be selected from metal oxides, metal nitrides, metal silicates, transition metal-oxides, transition metal-nitrides, transition metal-silicates, oxynitrides of metals, metal aluminates, zirconium silicate, zirconium aluminate, HfO2, or combinations thereof. The erase gate dielectric may have a multilayer structure such as one layer of silicon oxide and another layer of high k material. The erase gate dielectric may be formed using chemical vapor deposition (CVD), physical vapor deposition (PVD), atomic layer deposition (ALD), thermal oxide, other suitable processes, or combinations thereof.

The erase gate electrode may be designed to be coupled to the metal interconnects and may be disposed overlying the erase gate dielectric. The erase gate electrode includes polycrystalline silicon (or polysilicon). Alternatively, the erase gate electrode may include doped polysilicon, metal such as Al, Cu, W, Ti, Ta, TiN, TaN, NiSi, CoSi, other suitable conductive materials, or combinations thereof. The erase gate electrode may be formed by CVD, PVD, plating, and other proper processes. The erase gate electrode may have a multilayer structure and may be formed in a multiple step process. The erase gate electrode may have a layer of silicide, or any other material suitable to reduce resistance between the erase gate electrode and a contact, disposed thereon. The formation of the erase gate 240 may include various deposition and patterning that further includes lithography process and etch.

The floating gate 242 and the control gate 244 may include polysilicon, doped polysilicon, and combinations thereof. The floating gate 242 is deposited adjacent to the erase gate 240, and the control gate 244 is disposed above the floating gate 242. Although not shown in the figures, in some embodiments, the semiconductor structure 200 further includes another floating gate and control gate pair placed so as to couple to the common source region 220. In some embodiments, the semiconductor structure 200 further includes features, such as word lines and/or bit lines, for accessing cells of a memory array comprising the semiconductor structure 200. For example, as understood in the art, a word line can be formed adjacent to a floating gate and control gate. Furthermore, in some embodiments, the semiconductor structure 200 further includes spacers between various gates and between various gates and word lines or bit lines. For example, in some embodiments there are one or more spacers between the erase gate 240 and the control gate 244 and between the erase gate 240 and the floating gate 242. In some embodiments, the floating gate is formed by depositing a floating gate layer, followed by depositing a control gate, and finally etching of the floating gate layer.

The structure 200 shown in FIG. 2I comprises a flat erase gate 240 (or an erase gate 240 having a flat profile) over a common source region 220 having a comb-shaped or sawtooth-shaped profile with a dielectric material layer 230 disposed therebetween. The dielectric material layer 230 has a bottom surface with a sawtooth-shaped profile and a top surface with a flat profile. The erase gate 240 is disposed along a portion of the top surface of the dielectric material layer 230, and a portion of the bottom surface of the dielectric material layer 230 is in contact with the common source region 220.

Figure 3:
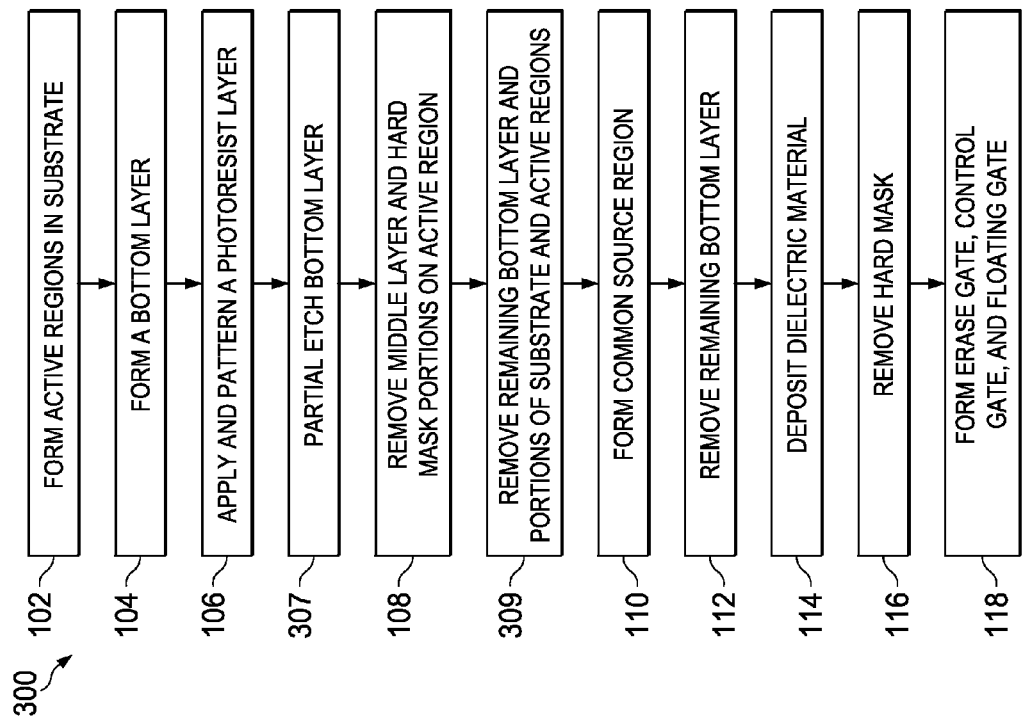
FIG. 3 is a flowchart illustrating a method of making a semiconductor structure according to various aspects of the present disclosure.

FIG. 3 is a flowchart of one embodiment of a method 300 of making a semiconductor structure. FIGS. 4A through 4I are perspective views of a semiconductor structure 400 at various stages of fabrication constructed according to aspects of the present disclosure in one or more embodiments. The semiconductor structure 400 and the method 300 of making the semiconductor structure are collectively described with reference to FIG. 3 and FIGS. 4A through 4I. As shown in FIG. 3, many of the operations of the method 300 are the same as the operations of the method 100. In the interest of clarity and conciseness this disclosure hereafter primarily focuses on the aspects of the method 300 that are different from the method 100. Operations 102 through 106 in method 300 are described previously and illustrated in FIGS. 4A and 4B.

Figure 4A:
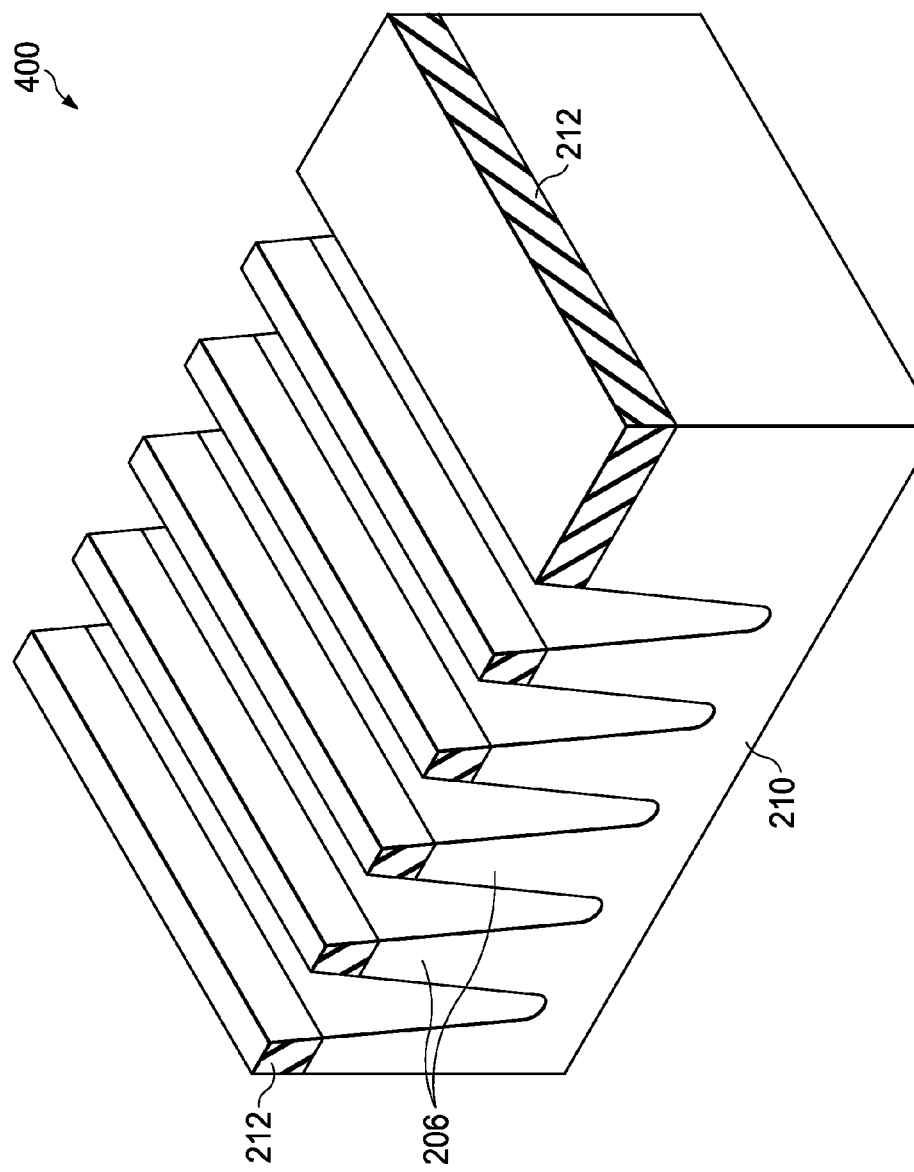
FIGS. 4A-4I illustrate perspective views of one embodiment of a semiconductor structure at various stages of fabrication according to the method of FIG. 3.
Figure 4B:
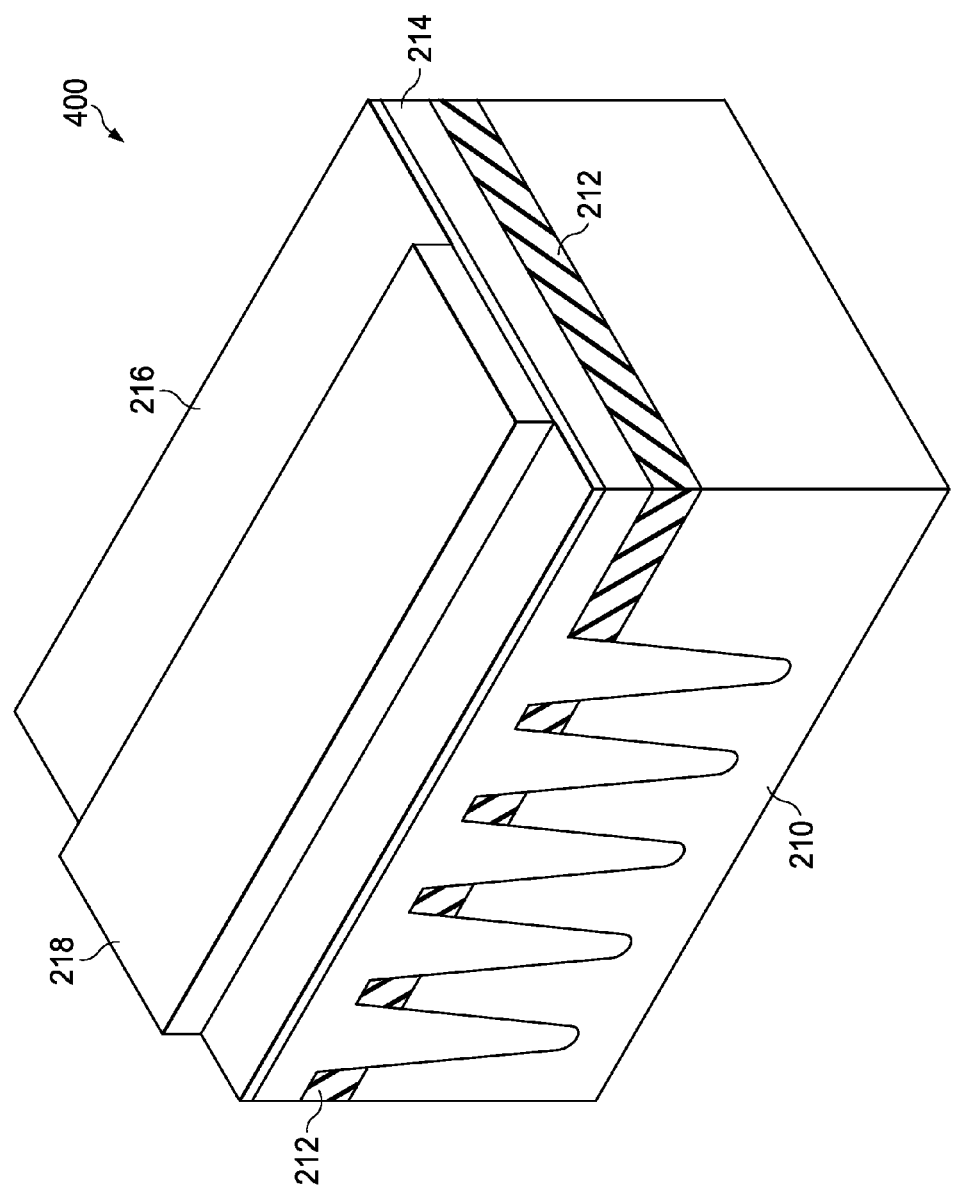
Figure 4C:
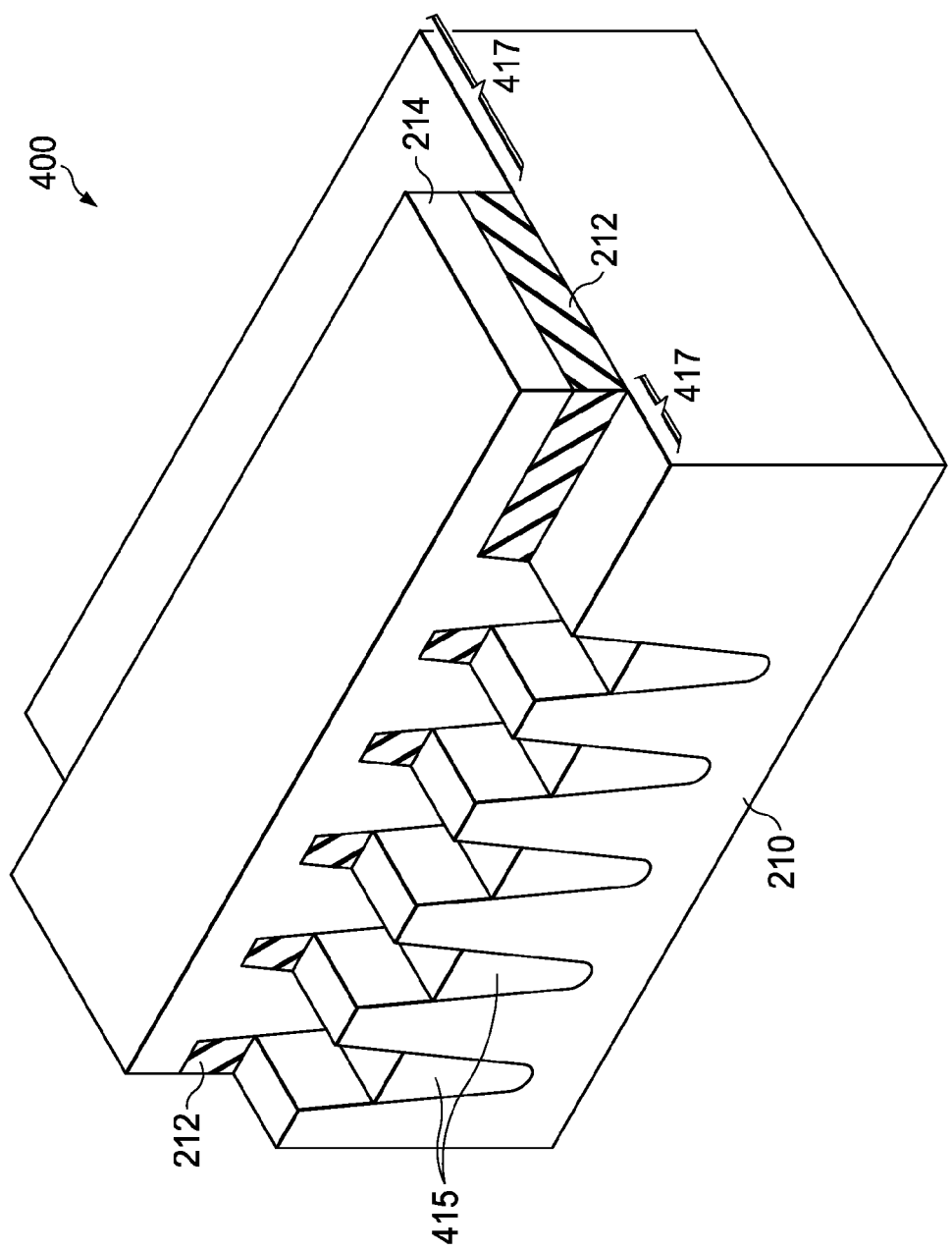

Referring to FIG. 3 and FIG. 4C, the method 300 continues in operation 307, by partially etching the exposed bottom layer 214. The partial etching results in having portions of trenches partially filled with bottom layer portions 415. The material removal or etching process can be tuned to leave bottom layer portions 415 of a desired size or depth. Referring to FIG. 3 and FIG. 4C, the method continues in operation 108 by removing the indicated portions of the bonding layer 216 and hard mask 212. The operation 108 yields exposed portions of the active regions 206 in partial recess regions 417.

Figure 4D:
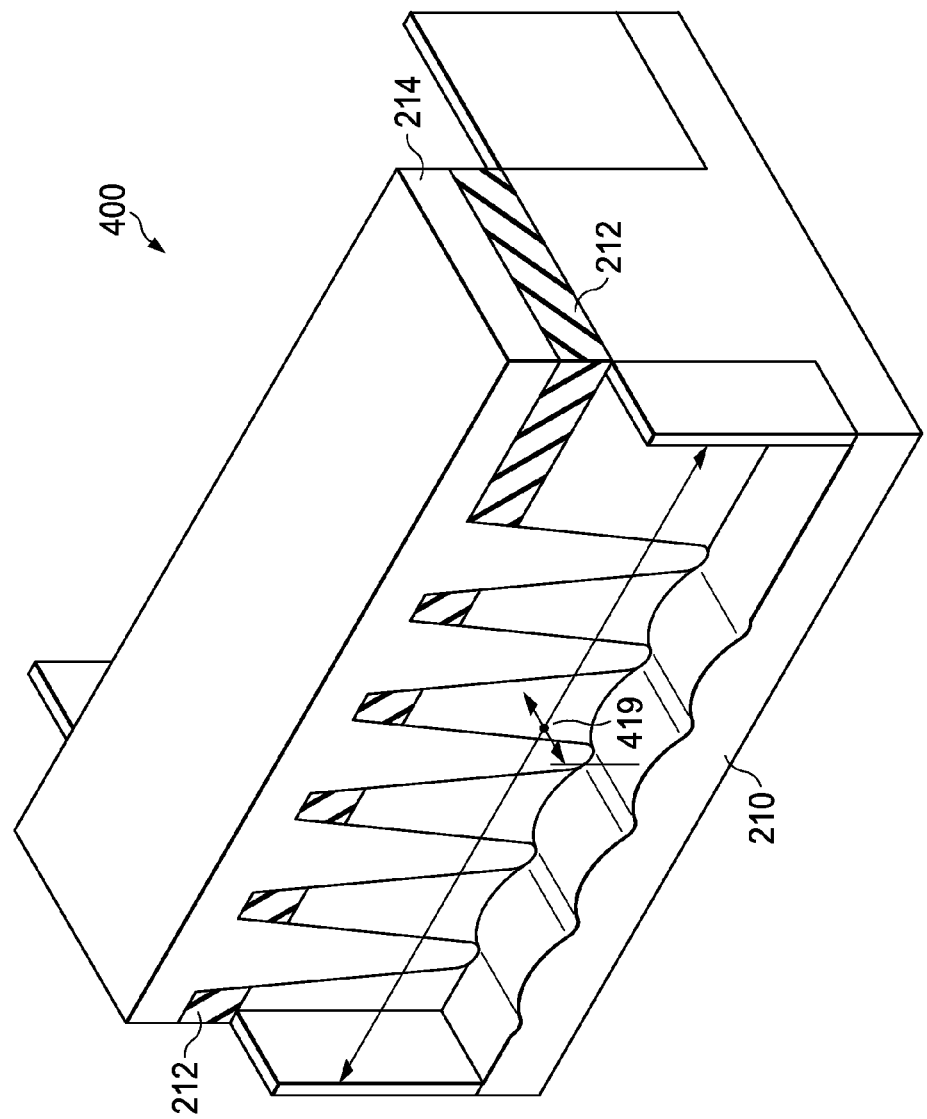

Referring to FIGS. 1 and 4D, the method continues in operation 309 by performing an etching process to remove substantially all of the bottom layer portions 415 as well as portions of the active regions in the substrate 210. The etching process results in recess or cavity 419 being formed. The etching process can be tuned to remove substantially all of the bottom layer portions 415 as well as the portions of the active regions 206 in the volume indicated by the cavity 419. In some embodiments, the surface at the bottom of the cavity 419 is substantially flat. As shown in FIG. 4D, the cavity 419 has a U-shaped profile and spans multiple active regions. The cavity 419 can also be described as a rectangular-shaped cavity that is open opposite the substrate 210.

Figure 4E:
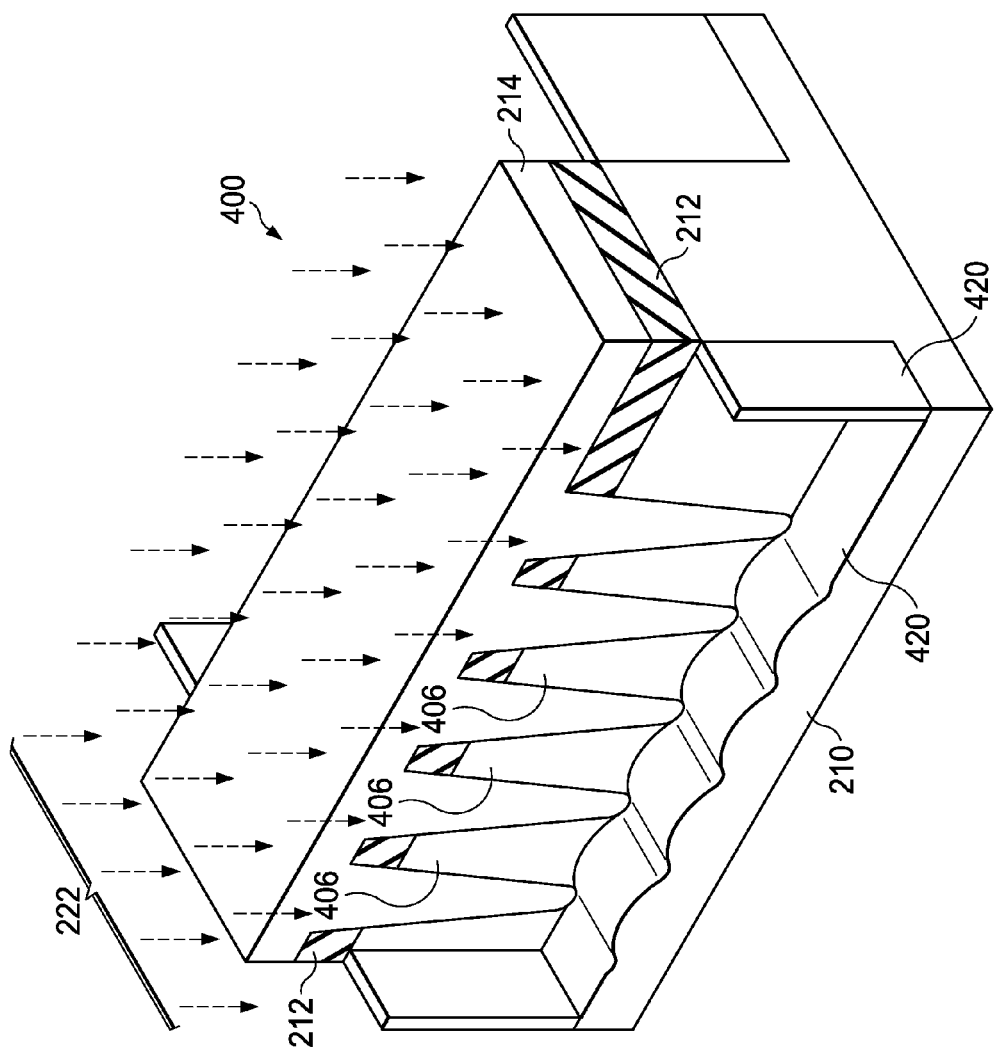
Figure 4F:
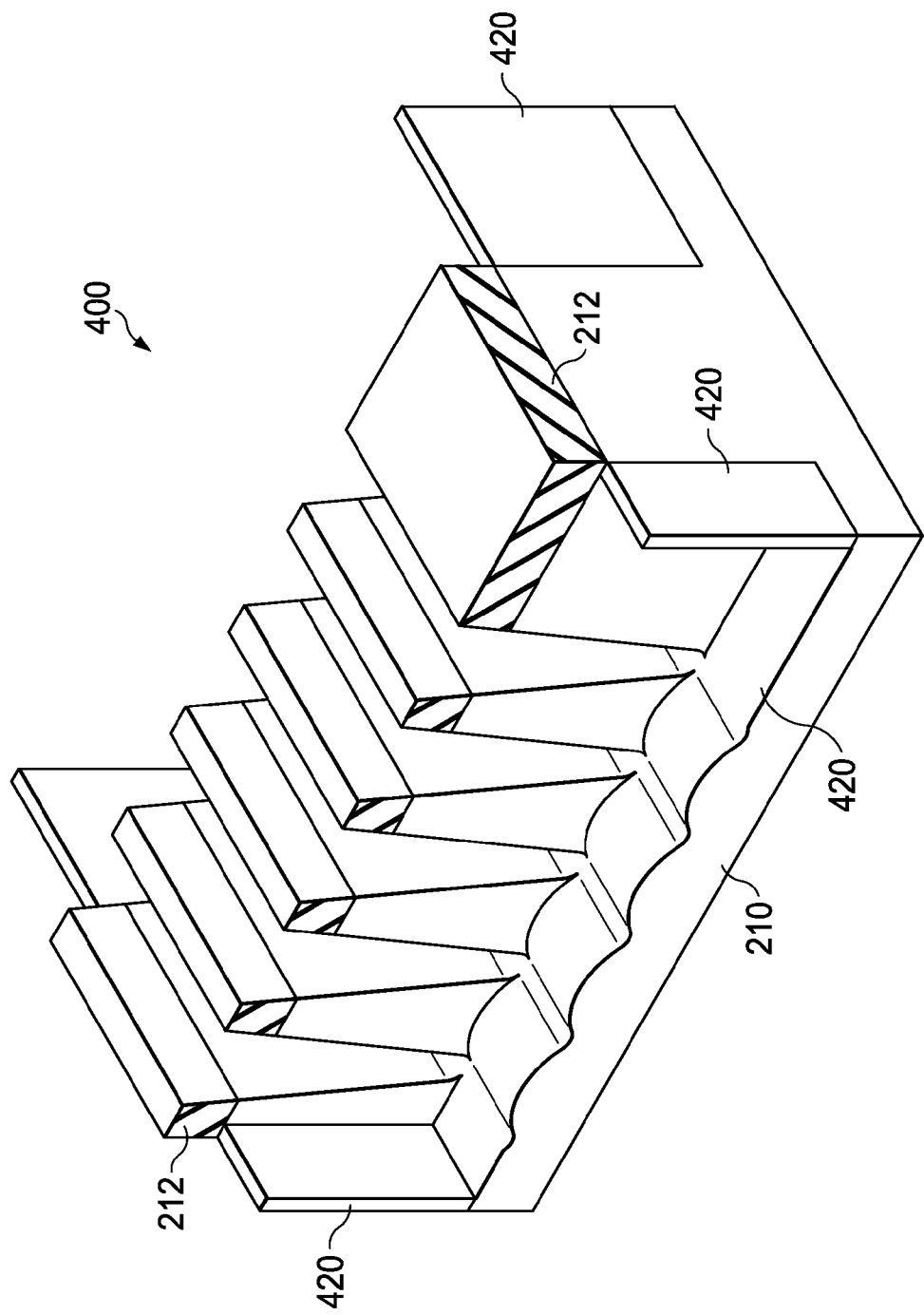
Figure 4G:
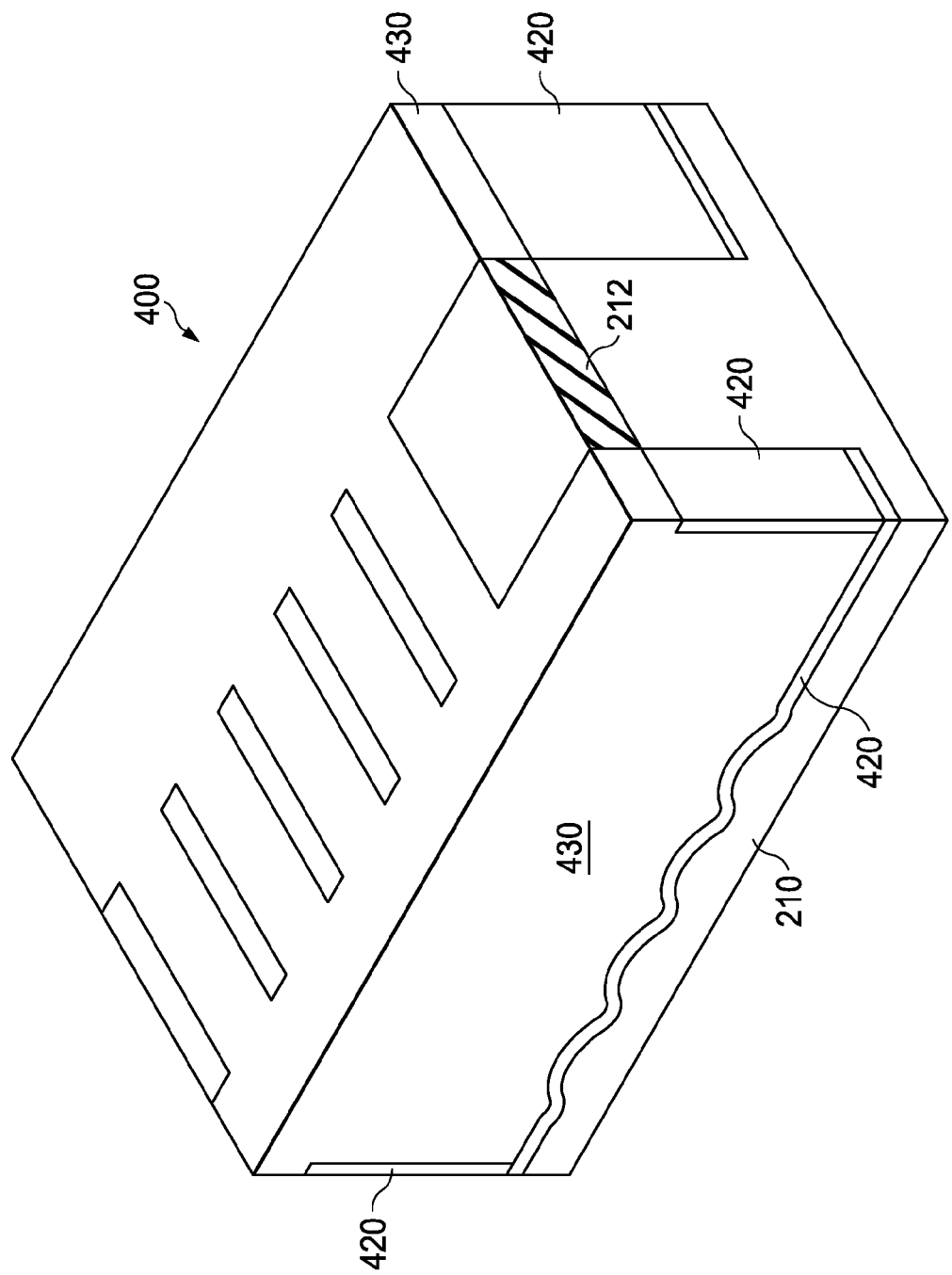
Figure 4H:
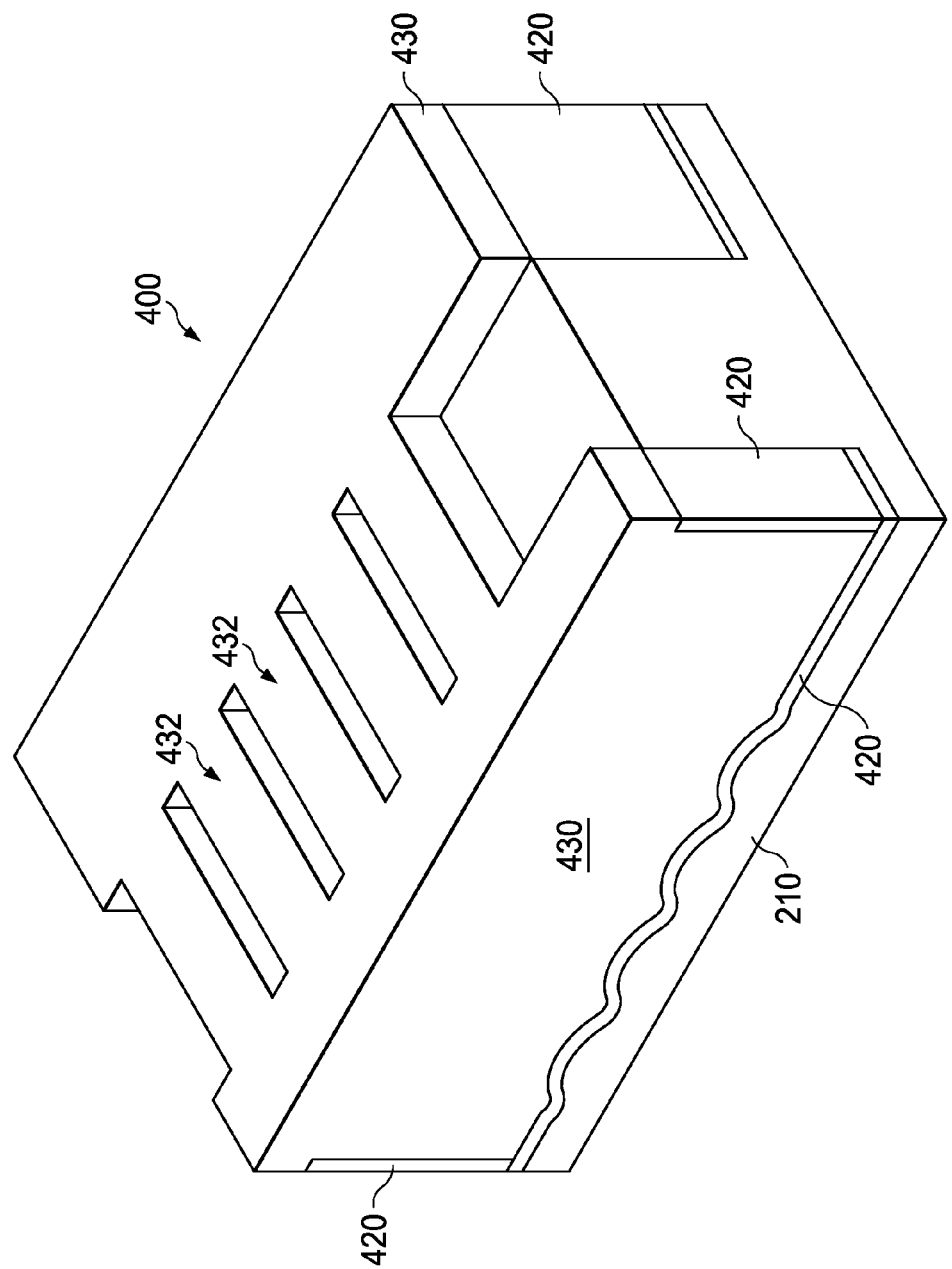

Referring to FIGS. 1 and 4E, the method continues in operation 110 by forming common source region 420 in the exposed areas of the cavity 419. The common source region 420 may be formed by various known ion implantation processes 222. The ion implantation processes 222 may result in a plurality of common source regions 420. In some embodiments, dopants such as P or As are used. Note that unlike conventional processes, a common source region 220 is formed before any corresponding floating gate or control gate. The common source region 420 has the U-shaped profile shown in FIG. 4E. The common source region 420 spans a plurality of active regions 406 in the substrate as shown. Operations 112 through 118 are described previously and are understood in conjunction with FIGS. 4F through 4I.

Figure 4I:
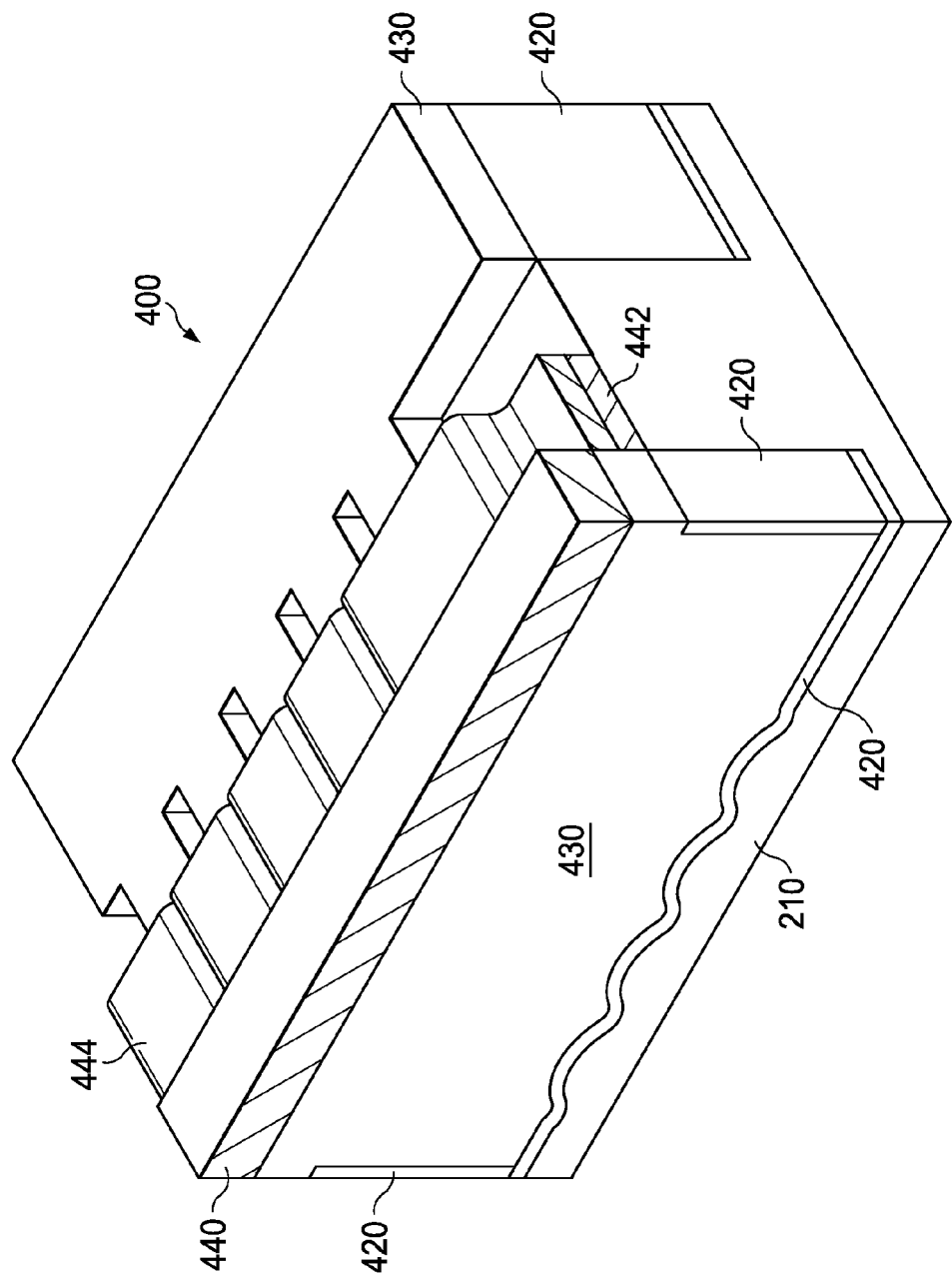

The structure 400 shown in FIG. 4I comprises a flat erase gate 440 over a common source region 420 having a U-shaped profile with a dielectric material layer 430 disposed therebetween. The structure shown in FIG. 4I can also be described as a rectangular dielectric material layer 230 with a common source region 420 on three sides and with an erase gate 440 disposed over the rectangular dielectric material layer 430 and aligned with the common source region 420. The dielectric material layer 432 comprises a plurality of shallow trench isolation features 432 in the trenches between the active regions.

The disclosed semiconductor structure 200 can be used in various microelectronic devices, such as in flash memory devices. Likewise, the disclosed semiconductor structure 400 can be used in various microelectronic devices, such as flash memory devices.

Thus, the present disclosure provides semiconductor structures. In at least one embodiment, a semiconductor structure includes a common source region having a saw-tooth profile; and a flat erase gate disposed above the common source region. In at least one embodiment, the semiconductor structure further includes a dielectric feature disposed between the common source region and the erase gate and having a bottom surface and a top surface, wherein the bottom surface has a sawtooth profile in contact with the common source region, and wherein the top surface has a flat profile in contact with the erase gate.

In at least one embodiment, a second semiconductor structure includes a plurality of active regions formed on a substrate; a common source region formed on the substrate and spanning the plurality of active regions, wherein the common source region has a U-shape; and a flat erase gate disposed above the common source region, wherein the active regions extend in a first direction, and wherein the common source region extends in a second direction perpendicular to the first direction. In at least one embodiment, the second semiconductor structure further includes a dielectric feature disposed between the common source region and the erase gate, wherein the dielectric feature comprises multiple shallow trench isolation features.

The present disclosure also provides a method of making a semiconductor structure. In at least one embodiment, the method includes forming a plurality of trenches in a substrate thereby forming a plurality of active regions; and forming a common source region in the substrate in a direction perpendicular to the active regions. Furthermore, the method further includes, after forming the common source region: forming a dielectric feature on the substrate thereby filling the trenches and forming a plurality of shallow trench isolation features; and forming an erase gate on the dielectric feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    a common source region having a sawtooth profile;
    a flat erase gate disposed above the common source region; and
    a dielectric feature disposed between the common source region and the flat erase gate, the dielectric feature having a bottom surface and a top surface, wherein the bottom surface has a sawtooth profile in continuous contact with the common source region, and wherein the top surface has a flat profile in contact with the flat erase gate.

2. The structure of claim 1, further comprising a substrate comprising alternating trenches and active regions, wherein the common source region lies in the substrate in a direction perpendicular to the trenches and active regions, and wherein the common source region spans the trenches and active regions.

3. The structure of claim 2, wherein the dielectric feature comprises a plurality of shallow trench isolation (STI) features disposed in the trenches, and wherein the flat erase gate is formed over the STI features.

4. The structure of claim 2, further comprising:
a floating gate adjacent to the flat erase gate; and
a control gate disposed above the floating gate,
wherein the flat erase gate is aligned with the common source region.

5. The structure of claim 2, wherein the dielectric feature completely fills the trenches in a region above the common source region.

6. A semiconductor structure comprising:
a plurality of active regions formed on a substrate, wherein the substrate includes a plurality of inverted U-shaped surfaces, the substrate having a U-shaped cavity formed therein, wherein the U-shaped cavity includes a first side surface and a second side surface extending from a bottom surface formed by the plurality of inverted U-shaped surfaces;
a common source region formed on the first side surface of the U-shaped cavity, the second side surface of the U-shaped cavity, and the plurality of inverted U-shaped surfaces of the bottom surface of the U-shaped cavity, wherein the common source region spans substrate and the plurality of active regions; and
a flat erase gate disposed over the common source region, wherein the flat erase gate spans the U-shaped cavity.

7. The structure of claim 6, further comprising a dielectric layer disposed between the common source region and the flat erase gate, wherein the dielectric layer includes a bottom surface formed by a plurality of inverted U-shaped surfaces and a top surface having a flat profile.

8. The structure of claim 7, wherein the dielectric layer forms shallow trench isolation features for electrically isolating the plurality of active regions.

9. The structure of claim 7, wherein the dielectric layer fills the U-shaped cavity, such that the dielectric layer spans the plurality of active regions and the common source region surrounds the dielectric layer on three sides.

10. The structure of claim 6, further comprising:
a floating gate disposed on the substrate adjacent to the flat erase gate; and
a control gate disposed over the floating gate, wherein the floating gate and the control gate each include an edge adjacent to an edge of the common source region.

11. The structure of claim 6, wherein the flat erase gate includes a first edge and a second edge defining a width of the flat erase gate, wherein the first edge and the second edge are substantially vertically aligned with edges of the common source region.

12. A semiconductor structure, comprising:
a substrate having a plurality of active regions;
a common source region disposed on the substrate, wherein the common source region spans the plurality of active regions;
a shallow trench isolation (STI) feature disposed on the common source region, such that the common source region is disposed between the substrate and the STI feature, wherein the STI feature continuously spans the plurality of active regions; and
an erase gate disposed on the STI feature directly over the common source region, wherein the erase gate has a width that spans the plurality of active regions.

13. The structure of claim 12, further comprising:
an etched bottom layer on the substrate that forms a saw-tooth shaped recess region, wherein the common source region is formed in a portion of the saw-tooth shaped recess region, such that the common source region has a sawtooth profile, and wherein the common source region spans the plurality of active regions.

14. The structure of claim 12, further comprising:
a control gate disposed over the substrate adjacent to the common source region; and
a floating gate disposed between the control gate and the substrate, the floating gate adjacent to the common source region.

15. The structure of claim 14, wherein an edge of the floating gate adjacent to the common source region is vertically aligned with an edge of the control gate.

16. The structure of claim 12, further comprising:
an etched bottom layer on the substrate that forms a recess region, wherein the recess region includes trenches and the recess region includes bottom layer portions in the trenches.

17. The structure of claim 12, wherein a U-shaped cavity is defined in the substrate, wherein the common source region is formed in sides of the U-shaped cavity, and wherein the common source region spans the plurality of active regions.

18. The structure of claim 12, wherein the STI feature has a top surface having a flat profile and a bottom surface having a non-flat profile conforming to a surface of the common source region, and further wherein the erase gate is formed on the top surface of the STI feature, and further wherein the erase gate has a top surface having a flat profile and a bottom surface having a flat profile.

19. The structure of claim 18, wherein the non-flat profile is a sawtooth-shaped profile or inverted U-shaped profile.

* * * * *